(12) United States Patent
Lee et al.

(10) Patent No.: US 9,331,131 B2
(45) Date of Patent: May 3, 2016

(54) ORGANIC LIGHT EMITTING DIODE DISPLAY AND MANUFACTURING METHOD THEREOF

(71) Applicant: SAMSUNG DISPLAY CO., LTD., Yongin, Gyeonggi-Do (KR)

(72) Inventors: Su-Hwan Lee, Yongin (KR); Mu-Hyun Kim, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/278,135

(22) Filed: May 15, 2014

(65) Prior Publication Data

US 2014/0353633 A1    Dec. 4, 2014

(30) Foreign Application Priority Data

May 28, 2013   (KR) .......................... 10-2013-0060057

(51) Int. Cl.
*H01L 27/32*   (2006.01)
*H01L 51/52*   (2006.01)

(52) U.S. Cl.
CPC .......... *H01L 27/326* (2013.01); *H01L 51/5228* (2013.01); *H01L 27/3246* (2013.01); *H01L 27/3276* (2013.01)

(58) Field of Classification Search
CPC .............................. H01L 27/326; H01L 51/56
USPC .................................... 257/40, 66, 43, 59, 89
See application file for complete search history.

(56) References Cited

U.S. PATENT DOCUMENTS

2002/0158835 A1 *  10/2002  Kobayashi et al. ........... 345/100
2007/0111369 A1     5/2007  Chun et al.

FOREIGN PATENT DOCUMENTS

| KR | 10-2006-0099262 A | 9/2006 |
|---|---|---|
| KR | 10-2007-0050723 A | 5/2007 |
| KR | 10-2007-0050725 A | 5/2007 |

* cited by examiner

*Primary Examiner* — Chuong A Luu
*Assistant Examiner* — Rodolfo Fortich
(74) *Attorney, Agent, or Firm* — Lee & Morse, P.C.

(57) ABSTRACT

An organic light emitting diode display includes a substrate including a thin film transistor, a plurality of pixels on a pixel area of the substrate, a plurality of auxiliary electrodes between the pixels, an opposite electrode on the pixels and on the auxiliary electrodes, the opposite electrode being electrically connected to the auxiliary electrodes, and including a same material as the auxiliary electrodes, and a power supply electrode on the substrate, the power supply electrode being in a periphery of the pixel area and being configured to supply power to the pixels.

20 Claims, 7 Drawing Sheets

ORGANIC LIGHT EMITTING DIODE DISPLAY AND MANUFACTURING METHOD THEREOF

CROSS-REFERENCE TO RELATED APPLICATION(S)

Korean Patent Applications No. 10-2013-0060057, filed on May 28, 2013, in the Korean Intellectual Property Office (KIPO), the contents of which are incorporated herein in its entirety by reference.

BACKGROUND

1. Field

Example embodiments relate generally to an organic light emitting diode display and a manufacturing method thereof.

2. Description of the Related Art

An organic light emitting display device, e.g., an organic light emitting diode (OLED) display device, is a light emissive type light emitting element. In the organic light emitting display device, a certain wavelength of light is generated from the energy of exitons, which are formed by recombination of electrons and holes injected into a light emitting layer. The electrons are injected to the light emitting layer from an electron injection electrode and the holes are injected to the light emitting layer from a hole injection electrode.

The organic light emitting display device is the light emissive type light emitting element which does not need an additional light source, e.g., does not require a separate backlight unit. The organic light emitting display device has advantages of a wide viewing angle, fast response speed, and thin thickness.

SUMMARY

According to some example embodiments, an organic light emitting diode display includes a substrate including a thin film transistor, a plurality of pixels on a pixel area of the substrate, a plurality of auxiliary electrodes between the pixels, an opposite electrode on the pixels and on the auxiliary electrodes, the opposite electrode being electrically connected to the auxiliary electrodes, and including a same material as the auxiliary electrodes, and a power supply electrode on the substrate, the power supply electrode being in a periphery of the pixel area and being configured to supply power to the pixels.

In example embodiments, the auxiliary electrodes may be formed between the pixels in a longitudinal direction of the substrate.

In example embodiments, the auxiliary electrodes may be formed between the pixels in a horizontal direction of the substrate.

In example embodiments, the auxiliary electrodes may be formed between the pixels in a longitudinal and a horizontal direction of the substrate.

In example embodiments, the auxiliary electrodes may be formed in straight lines.

In example embodiments, the auxiliary electrodes may be formed in dotted lines.

In example embodiments, the auxiliary electrodes may be disposed under the opposite electrode and the auxiliary electrodes may be thicker than the opposite electrode.

In example embodiments, only the opposite electrode among the opposite electrode and the auxiliary electrodes may overlap the pixels.

In example embodiments, the power supply electrode may be disposed on the periphery of the pixel area and the power supply electrode may have the same height as the opposite electrode that is in the pixel area.

In example embodiments, the power supply electrode may be disposed on both sides of the substrate along an edge of the substrate in a row.

In example embodiments, the power supply electrode is disposed on one side of the substrate along an edge of the substrate in a row.

According to an aspect of another embodiment, a method of manufacturing an organic light emitting display device includes forming a pixel electrode on a pixel area of a substrate, which includes a thin film transistor, the pixel electrode being electrically connected to the thin film transistor, forming a pixel defining layer having an opening exposing the pixel electrode on the substrate, forming an intermediate layer including a light emitting layer on the pixel electrode exposed through the opening of the pixel defining layer, forming a plurality of auxiliary electrodes on the pixel defining layer, the auxiliary electrodes being between the pixels, forming an opposite electrode on the intermediate layer and on the auxiliary electrodes, the opposite electrode being electrically connected to the auxiliary electrodes and being formed of a same material as the auxiliary electrodes, and forming a power supply electrode on the substrate, the power supply electrode being in a periphery of the pixel area and being configured to supply power to the pixels.

In example embodiments, the method may further include forming a power supply electrode on a periphery of the substrate.

In example embodiments, the intermediate layer may comprise a first common layer, the light emitting layer, and a second common layer.

In example embodiments, the first common layer and the second common layer may be overlapped with the pixel defining layer and the pixel electrode and wherein the light emitting layer may be formed on the pixel electrode.

In example embodiments, the first common layer may comprise a hole injection layer and a hole transport layer which are sequentially stacked.

In example embodiments, the second common layer may comprise an electron transport layer and an electron injection layer which are sequentially stacked.

In example embodiments, the auxiliary electrodes may be thicker than the opposite electrode.

In example embodiments, the power supply electrode may be on the substrate and has the same height with the auxiliary electrode and the opposite electrode.

BRIEF DESCRIPTION OF THE DRAWINGS

Illustrative, non-limiting example embodiments will be more clearly understood from the following detailed description taken in conjunction with the accompanying drawings, in which.

DETAILED DESCRIPTION

Figure 1:
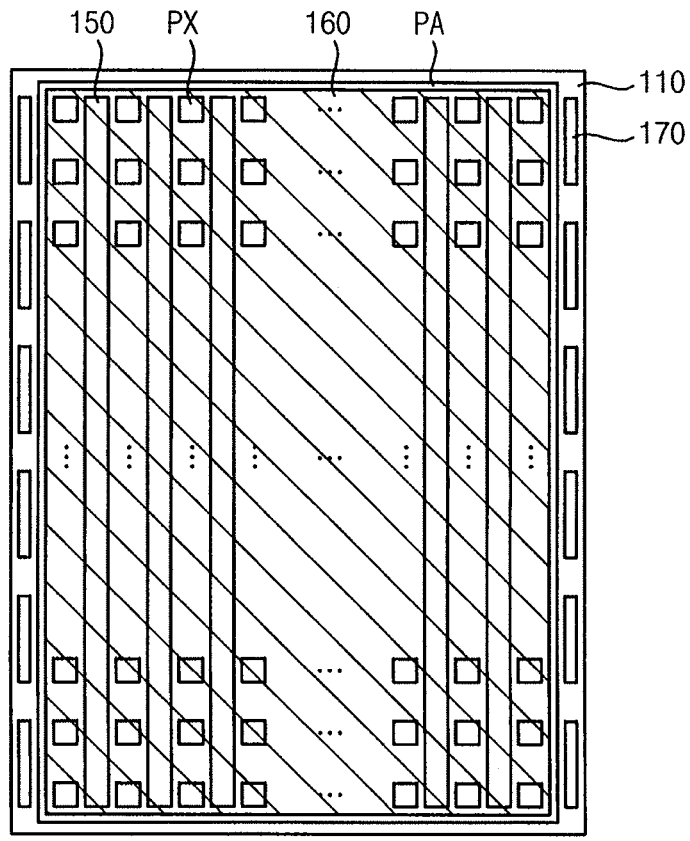
FIG. 1 is a plane view of an arrangement of a pixel and an electrode of an organic light emitting diode display according to one example embodiment.

Various example embodiments will be described more fully hereinafter with reference to the accompanying drawings, in which some example embodiments are shown. Embodiments may, however, be embodied in many different forms and should not be construed as limited to those set forth herein. Rather, these example embodiments are provided so that this disclosure will be thorough and complete, and will fully convey exemplary implementations to those skilled in the art. In the drawings, the sizes and relative sizes of layers and regions may be exaggerated for clarity. Like reference numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," "on" versus "directly on," etc.).

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
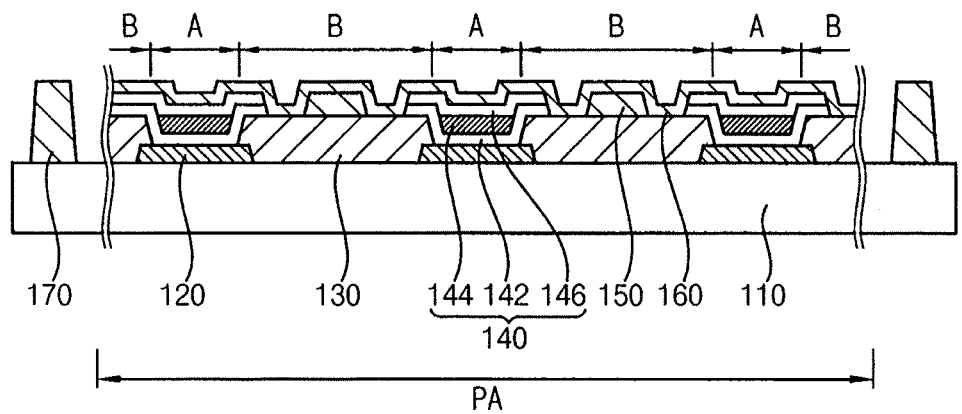
FIG. 2 is a cross-sectional view of the organic light emitting diode display of FIG. 1.

FIG. 1 is a plane view illustrating an arrangement of a pixel and an electrode of an organic light emitting diode display according to one example embodiment. FIG. 2 is a cross-sectional view illustrating the organic light emitting diode display of FIG. 1.

Referring to FIG. 1, an organic light emitting diode display 100 may include a substrate 110, a pixel Px, an auxiliary electrode 150, an opposite electrode 160, and a power supply electrode 170.

The substrate 110 may include a transparent glass material, a plastic material, or a metal foil, but is not limited thereto.

Thus, a substrate that is generally used in an organic light emitting diode display may be used. The substrate 110 exhibits good mechanical strength, thermal stability, transparency, surface smoothness, easy usage, and good water proofing property.

The pixel Px may be arranged in a matrix shape at constant distance in a pixel area PA. The pixel Px may emit red (R), green (G), and blue (B) colors based on the material that forms a light emitting layer.

The auxiliary electrode 150 may be disposed on the substrate 110 between pixels Px in a longitudinal direction of the substrate 110 in the pixel area PA. For example, the auxiliary electrode 150 may be disposed, e.g., only, between, e.g., adjacent, pixels Px so that light emission of the pixel Px is not affected.

The auxiliary electrode 150 may be formed under the opposite electrode 160. The opposite electrode 160 covers the pixel area PA at uniform thickness. The auxiliary electrode 150 may be formed thicker than the opposite electrode 160, and may be electrically connected to the opposite electrode 160. The connection of the auxiliary electrode 150 and the opposite electrode 160 may prevent a non-uniform luminance defect caused by IR-drop in a large-scaled substrate 110.

For example, the auxiliary electrode 150 may be formed in, e.g., continuous, straight lines. In another example, the auxiliary electrode 150 may be formed in dotted, e.g., discontinuous, lines to compensate for a tensile force of a mask.

The opposite electrode 160 may be formed on the entire substrate 110 at a thin thickness. The IR-drop that is caused by the thin opposite electrode 160 may be compensated by the auxiliary electrode 150. The auxiliary electrode 150 is electrically connected to the opposite electrode 160. The thickness and structure of the auxiliary electrode 150 and the opposite electrode 160 will be described in more detail below with reference to FIG. 2.

The power supply electrode 170 is connected to an externally provided power supply to supply power to each pixel Px. The power supply electrode 170 may be disposed on a periphery of the pixel area PA along both sides of the substrate 110.

When the substrate 110 e.g., has a large size, e.g., large scale, IR-drop is formed at a region of the substrate 110 spaced apart from the power supply electrode 170. Thus, luminance may be non-uniform. However, in the present example embodiment, the power supply electrodes 170 are formed along both sides of the substrate, so that the power is evenly supplied all over the substrate 110. When the thickness of the power supply line 170 is increased, the IR-drop may be compensated. When the substrate 110 has a small size, e.g., small scale, the organic light emitting diode display 100 may be manufactured with uniform luminance although the power supply electrode 170 is disposed along only one side of the substrate 110.

Referring to FIG. 2, the organic emitting diode display 100 may further include a pixel electrode 120, a pixel defining layer 130, and an intermediate layer 140 on the substrate 110.

As described previously, the substrate 110 may include a transparent glass material, a plastic material, or a metallic foil, but is not limited thereto. Thus, a substrate that is generally used in an organic light emitting diode display may be used. The substrate 110 has good mechanical strength, thermal stability, transparency, surface smoothness, easy usage, and good water proofing property. Although not illustrated in the figures, the substrate 110 may include at least one thin film transistor and/or a capacitor. A pixel circuit may be implemented using the thin film transistor and the capacitor.

The pixel electrode 120 may be formed on the substrate 110. The pixel electrode 120 may be connected to the thin film transistor (not shown) through a via-hole (not shown). The pixel electrode 120 may include a transmission electrode or a reflective electrode based on a display type of the organic light emitting diode display 100. The display type may be a top illumination type or a bottom illumination type.

When the pixel electrode 120 is a transmission electrode, the pixel electrode 120 may include a transparent conductive material, e.g., indium tin oxide (ITO), indium zinc oxide (IZO), zinc tin oxide (ZTO), zinc oxide ($ZnO_x$) or tin oxide ($SnO_x$). When the pixel electrode 120 is a reflective electrode, the pixel electrode 120 may include a reflective layer, e.g., at least one of silver (Ag), magnesium (Mg), aluminum (Al), platinum (Pt), palladium (Pd), silver (Au), chromium (Cr), tungsten (W), molybdenum (Mo), titanium (Ti) and a combination thereof, and a layer of at least one of, e.g., indium tin oxide (ITO), indium zinc oxide (IZO), zinc oxide ($ZnO_x$) or tin oxide ($SnO_x$).

The pixel defining layer 130 may be formed on the pixel electrode 120. The pixel defining layer 130 may contain various insulating materials, and includes an opening exposing a predetermined area of the pixel electrode 120.

An emission area A, i.e., a pixel area of the organic light emitting diode display 100, and a non-emission area B, i.e., a non-pixel area of the organic light emitting diode display 100, are defined by the pixel defining layer 130 formed. That is, the pixel electrode 120 exposed by the pixel defining layer 130 is in the emission area A, while a covered part of the pixel electrode 120 and the pixel defining layer 130 are in the non-emission area B.

The pixel defining layer 130 may be formed of an organic material, an inorganic material, or an organic-inorganic material multi layer. The inorganic material may include at least one of, e.g., silicon dioxide ($SiO_2$), silicon nitride ($SiN_x$), and silicon oxynitride (SiON). The organic material may include at least one of, e.g., an acryl-based organic compound, polyamide, and polyimide, which are organic insulating materials.

The intermediate layer 140 may be formed on the exposed portion of the pixel electrode 120. The intermediate layer 140 may be formed not only on the pixel electrode 120 but also on partial area of the pixel defining layer 130.

The intermediate layer 140 includes a first common layer 142, a light emitting layer 144, and a second common layer 146 which are sequentially stacked. When power is applied to the pixel electrode 120 and the opposite electrode 140, the light emitting layer 144 emits light.

The first common layer 142 and the second common layer 146 may be formed on the pixel electrode 120 and the pixel defining layer 130 commonly, and the light emitting layer 144 may be formed, e.g., only on the pixel electrode 120. The first common layer 142 may include a hole injection layer (HIL) and a hole transport layer (HTL), which are sequentially stacked, and the second common layer 146 may include an electron transport layer (ETL) and an electron injection layer (EIL), which are sequentially stacked. Besides these layers, other layers may be disposed as necessary. The light emitting layer 144 may be formed of low molecular organic materials, e.g., tris-8-hydroxyquinoline aluminum (Alq3), naphthalene-1-yl-N,N'-diphenyl-benzidine (NPB), and the like, or of high molecular organic materials, e.g., polyphenylene vinylene (PPV), polyfluorene, and the like.

The auxiliary electrode 150 may be formed on, e.g., directly on, the pixel defining layer 130, which is not overlapped with the intermediate layer 140. In other words, the auxiliary electrode 150 is disposed in the non-emission area B, so that light emission of the pixel is not affected. Further, the auxiliary electrode 150 may be disposed under the opposite electrode 160, e.g., the auxiliary electrode 150 may be between the pixel defining layer 130 and the opposite electrode 160, and may be electrically connected to the opposite electrode 160. The auxiliary electrode 150 which is formed thicker than the opposite electrode may prevent IR-drop in a large-scaled substrate 110.

The auxiliary electrode 150 may be formed of a same material as the opposite electrode 160, and may be formed thicker than about 1500 Å. The thickness of the auxiliary electrode 150 may be changed considering a scale of the substrate 110, a thickness of the pixel electrode 120, the intermediate layer 140 and the pixel defining layer 130, and the like.

The opposite electrode 160 is formed to cover the entire pixels Px. That is, the opposite electrode 160 is formed on the pixel defining layer 130, the intermediate layer 140, and the auxiliary electrode 150. The opposite electrode 160 is electrically connected to the auxiliary electrode 150 because the opposite electrode 160 is formed of the same material as the auxiliary electrode 150.

When the opposite electrode 160 is thickly formed on the pixel electrode 120, on which impurities remain, a short circuit may occur because the material of the opposite electrode 160 flows into the pixel electrode 120. Therefore, a dark spot defect may be generated by the short circuit.

In order to prevent the dark spot defect caused by the short circuit between the pixel electrode 120 and the opposite electrode 160, the opposite electrode 160 may be formed thinly within a range of about 300 Å to about 1500 Å. Accordingly, such a thin opposite electrode 160 may prevent the material of the opposite electrode 160 from flowing into the pixel electrode 120. Further, as described above, the IR-drop that may be caused by the thin opposite electrode 160 is compensated by the thick auxiliary electrode 150.

In the present example embodiment, the thickness of the opposite electrode 160 is assumed from 300 Å to 1500 Å. However, the thickness of the opposite electrode 160 is not limited thereto, and the thickness of the opposite electrode 160 may have diverse range considering the scale of the substrate 110 and the thickness of the organic layer.

The opposite electrode 160 may include a transmission electrode or a reflective electrode. When the opposite electrode 160 is a transmission electrode, the material of the opposite electrode 160 may be one of, e.g., lithium (Li), calcium (Ca), lithium fluoride/calcium (LiF/Ca), lithium fluoride/aluminum (LiF/Al), aluminum (Al), magnesium (Mg), argentums (Ag), chrome (Cr), tungsten (W), molybdenum (Mo), titanium (Ti), and a combination thereof.

The power supply electrode 170 may be formed on a periphery of the pixel area PA area along the side of the substrate 110. As described previously, when the thin opposite electrode 160 is formed to prevent the short circuit between the pixel electrode 120 and the opposite electrode 160, which is caused by impurities that remain on the pixel electrode 120, non-uniform luminance defect caused by IR-drop may be generated in a large-scale substrate 110. The IR drop may be compensated by forming the power supply electrode 170 thickly.

Thus, the power supply electrode 170 may be thick and may extend to a same height as the opposite electrode 160 in the pixel area, e.g., an upper surface of the power supply electrode 170 may be level with an upper surface of the opposite electrode 160 in the pixel area. For example, on an upper surface of the substrate 110, the pixel defining layer 130 may be formed at about 1500 Å, the auxiliary electrode 150 may be formed at about 1500 Å, and the opposite electrode 160 may be formed at about 300 Å. Further, the power supply electrode 170 may be formed directly on the upper surface of the substrate 110 to a thickness of about 3300 Å, i.e., a thickness that equals a sum of the thicknesses of the pixel defining layer 130, the auxiliary electrode 150, and the opposite electrode 160 sequentially stacked on the substrate 110.

The power supply electrode 170 may be formed of low resistance metal, e.g., aluminum (Al), silver (Ag), chromium (Cr), aluminum-neodymium (AlNd), and/or aluminum/molybdenum (Al/Mo). However, the power supply electrode 170 is not limited thereto, and may include various metal materials.

In the present example embodiment, the pixel electrode 120 and the opposite electrode 160 are assumed to be an anode electrode and a cathode electrode, respectively. However, embodiments are not limited thereto, and the polarity of the pixel electrode 120 and the opposite electrode 160 may be the opposite thereto. Furthermore, materials forming the pixel electrode 120 and the opposite electrode 160 are illustrative examples. Thus, other materials may be used to form the pixel electrode 120 and the opposite electrode 160.

Figure 3:
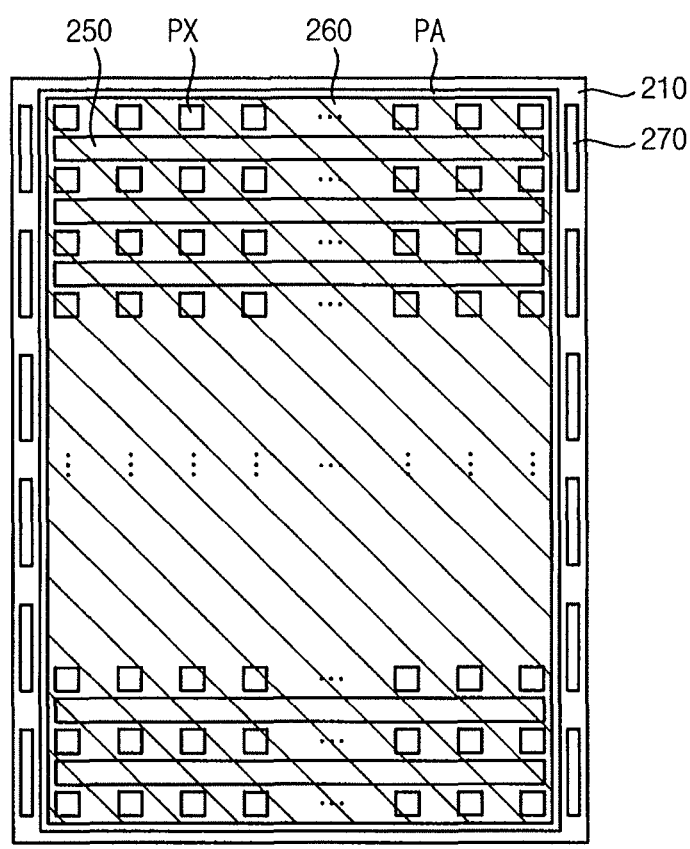
FIG. 3 is a plane view of an arrangement of a pixel and an electrode of an organic light emitting diode display according to another example embodiment.

FIG. 3 is a plane view illustrating an arrangement of a pixel and an electrode of an organic light emitting diode display according to another example embodiment.

Referring to FIG. 3, an organic light emitting diode display 200 may include a substrate 210, the pixel Px, an auxiliary electrode 250, an opposite electrode 260, and a power supply electrode 270.

The substrate 210 may include a transparent glass material, a plastic material, or a metal foil, but is not limited thereto. Thus, a substrate that is generally used in an organic light emitting diode display may be used. The substrate 210 has good mechanical strength, thermal stability, transparency, surface smoothness, easy usage, and good water proofing property.

The pixel Px may be arranged in a matrix shape at a constant distance in the pixel area PA. The pixel Px may emit red (R), green (G)m and blue (B) colors based on the material that forms a light emitting layer.

The auxiliary electrode 250 may be disposed on the substrate 210 between pixels Px in a horizontal direction of the substrate 210 in the pixel area PA. For example, a longitudinal direction of the auxiliary electrode 250 may be perpendicular to a longitudinal direction of the power supply electrode 270, e.g., as compared to longitudinal directions of the auxiliary electrode 150 and the power supply electrode 170 in FIG. 1 that are parallel to each other. The auxiliary electrode 250 is disposed between the pixels Px so that light emission of the pixel Px is not affected.

The auxiliary electrode 250 may be formed under the opposite electrode 260. The opposite electrode 260 covers the pixel area PA at a uniform thickness. The auxiliary electrode 250 may be formed thicker than the opposite electrode 260, and may be electrically connected to the opposite electrode 260. The connection of the auxiliary electrode 250 and the opposite electrode 260 may prevent non-uniform luminance defect caused by IR-drop in a large-scaled substrate 210. For example, the auxiliary electrode 250 may be formed in straight lines. In another example, the auxiliary electrode 250 may be formed in dotted lines to compensate for a tensile force of a mask.

The opposite electrode 260 may be formed on the entire substrate 210 at a thin thickness. The IR-drop that is caused by the thin opposite electrode 260 may be compensated by the auxiliary electrode 250. The auxiliary electrode 250 is electrically connected to the opposite electrode 260. The structure of the opposite electrode 260, as well as the relative thickness of the auxiliary electrode 250 and the opposite electrode 260, are the same as those of the respective auxiliary electrode 150 and opposite electrode 160 described previously with reference to FIG. 2.

The power supply electrode 270 is connected to an externally provided power supply to supply the power to each pixel Px. The power supply electrode 270 may be disposed on a periphery of the pixel area PA along both side of the substrate 210.

When the substrate 210 has large scale, IR-drop is formed at a region of the substrate 210 spaced apart from the power supply electrode 270. Thus, luminance may be non-uniform. However, in the present example embodiment, the power supply electrodes 270 are formed along both sides of the substrate so that the power is evenly supplied all over the substrate 210. When the thickness of the power supply line 270 is increased, the IR-drop may be compensated. When the substrate 210 has small scale, the organic light emitting diode display 200 may be manufactured with a uniform luminance although the power supply electrode 270 is disposed along only one side of the substrate 210.

Figure 4:
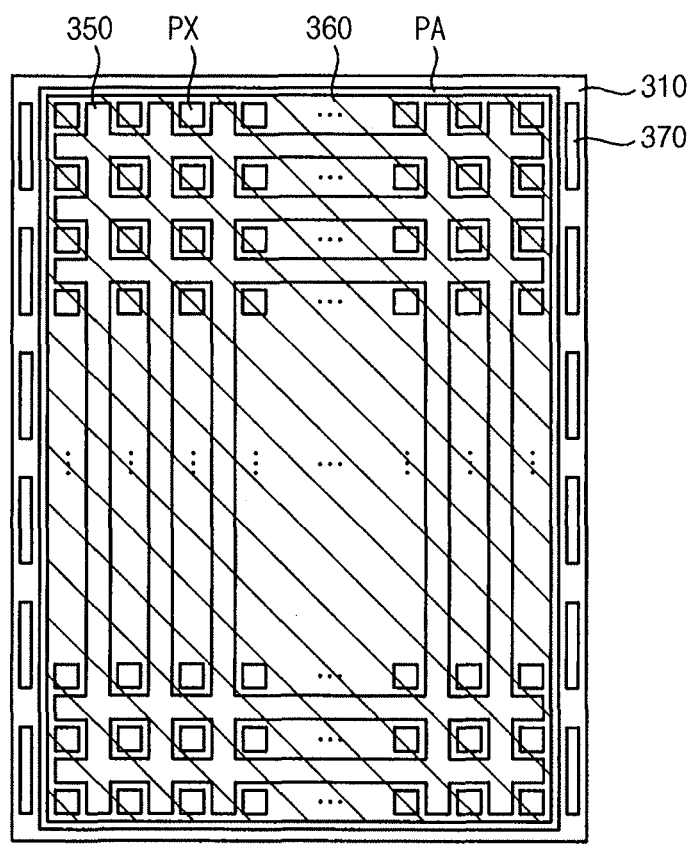
FIG. 4 is a plane view of an arrangement of a pixel and an electrode of an organic light emitting diode display according to still another example embodiment.

FIG. 4 is a plane view illustrating an arrangement of a pixel and an electrode of an organic light emitting diode display according to still another example embodiment.

Referring to FIG. 4, an organic light emitting diode display 300 may include a substrate 310, the pixel Px, an auxiliary electrode 350, an opposite electrode 360, and a power supply electrode 370.

The substrate 310 may include a transparent glass material, a plastic material, or a metal foil, but is not limited thereto. Thus, a substrate that is generally used in an organic light emitting diode display may be used. The substrate 310 has good mechanical strength, thermal stability, transparency, surface smoothness, easy usage, and good water proofing property.

The pixel Px may be arranged in a matrix shape at a constant distance in the pixel area PA. The pixel Px may emit red (R), green (G), and blue (B) colors based on the material that forms a light emitting layer.

The auxiliary electrode 350 may be disposed on the substrate 310 between pixels Px in a longitudinal direction and in a horizontal direction of the substrate 310 in the pixel area PA. For example, as illustrated in FIG. 4, the auxiliary electrode 350 may have an approximate grid pattern, so the pixels Px may be positioned in openings defined by the grid pattern. The auxiliary electrode 350 is disposed between the pixels Px so that light emission of the pixel Px is not affected.

The auxiliary electrode 350 may be formed under the opposite electrode 360. The opposite electrode 360 covers the pixel area PA at uniform thickness. The auxiliary electrode 350 may be formed thicker than the opposite electrode 360, and may be electrically connected to the opposite electrode 360. The connection of the auxiliary electrode 350 and the opposite electrode 360 may prevent non-uniform luminance defect caused by IR-drop in a large-scaled substrate 310.

For example, the auxiliary electrode 350 may include, e.g., continuous, straight lines. In another example, the auxiliary electrode 350 may be formed in, e.g., discontinuous, dotted lines to compensate for a tensile force of the mask which is used in the process.

The opposite electrode 360 may be formed on the entire substrate 310 at a thin thickness. The IR-drop that is caused by the thin opposite electrode 360 may be compensated by the auxiliary electrode 350. The auxiliary electrode 350 is electrically connected to the opposite electrode 360. The structure of the opposite electrode 360, as well as the relative thickness of the auxiliary electrode 350 and the opposite electrode 360, are the same as those of the respective auxiliary electrode 150 and opposite electrode 160 described previously with reference to FIG. 2.

The power supply electrode 370 is connected to an externally provided power supply to supply the power to each pixel Px. The power supply electrode 370 may be disposed on a periphery of the pixel area PA along both sides of the substrate 310.

When the substrate 310 has large scale, IR-drop is formed at a region of the substrate 310 spaced apart from the power supply electrode 370. Thus, luminance may be non-uniform. However, in the present example embodiment, the power supply electrodes 370 are formed along both sides of the substrate so that the power is evenly supplied all over the substrate 310. When the thickness of the power supply line 370 is increased, the IR-drop may be compensated. When the substrate 310 has small scale, the organic light emitting diode display 100 may be manufactured at uniform luminance although the power supply electrode 370 is disposed along only one side of the substrate 310.

Figure 5:
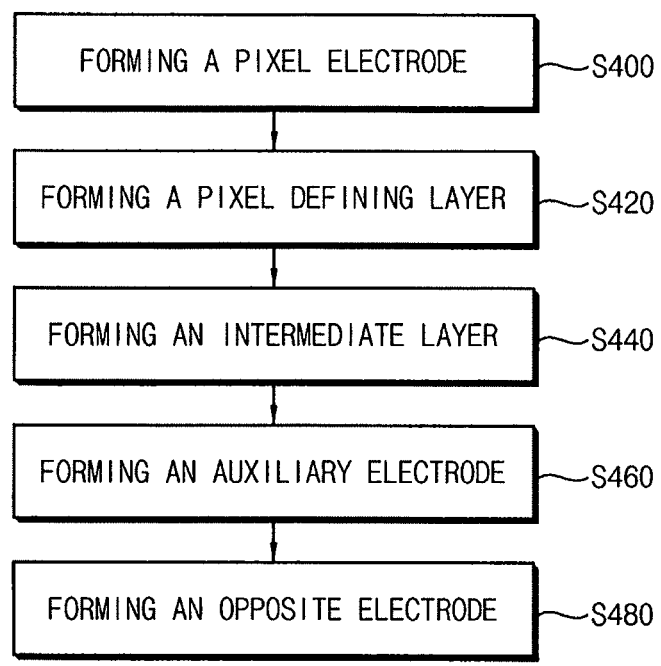
FIG. 5 is a flowchart of a method of manufacturing an organic light emitting diode display according to one example embodiment.
Figure 6A:
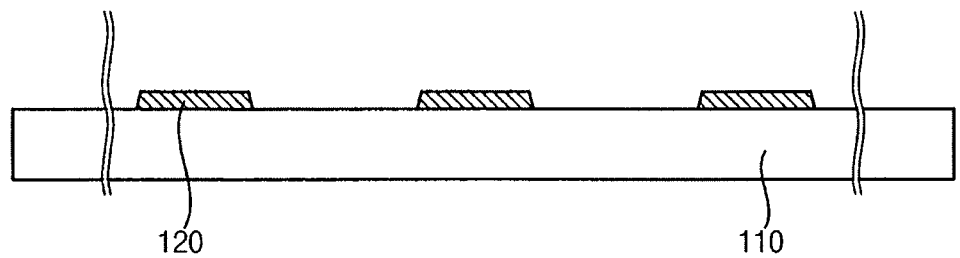
FIGS. 6A and 6E are cross-sectional views of stages in the method of FIG. 5.
Figure 6B:
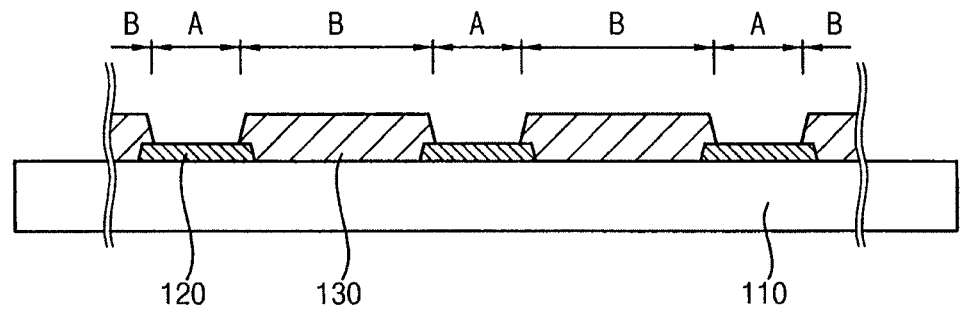
Figure 6C:
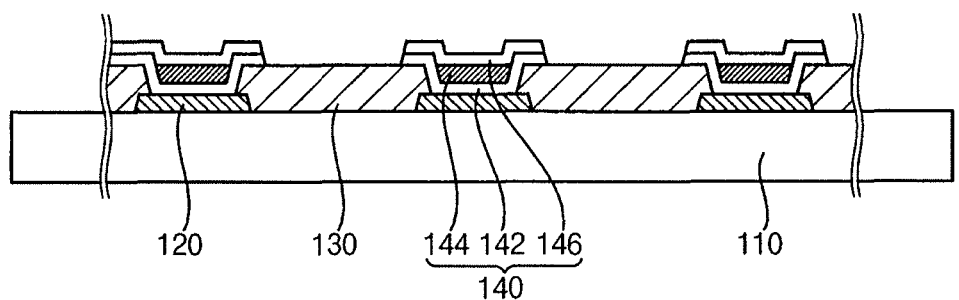
Figure 6D:
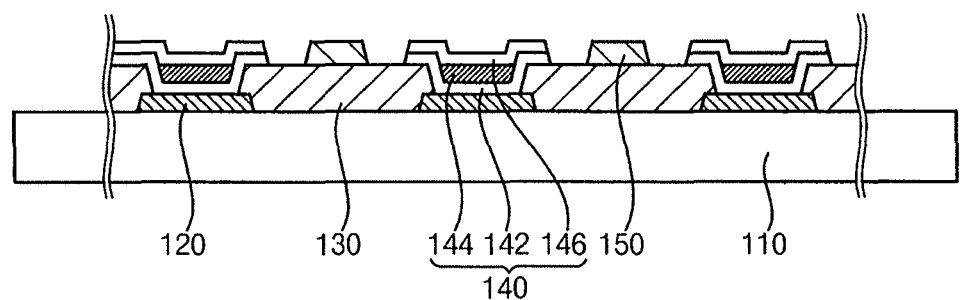
Figure 6E:
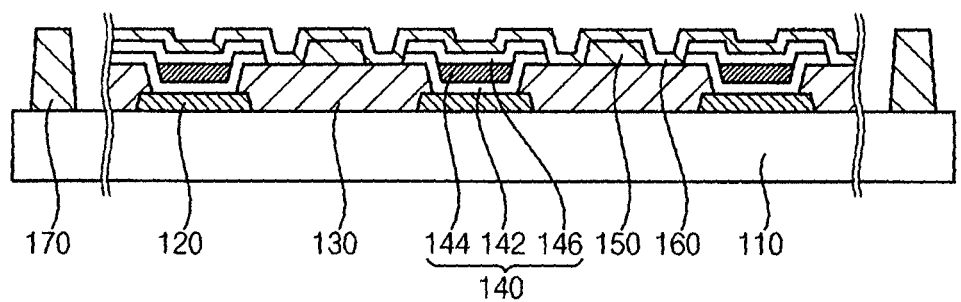

FIG. 5 is a flowchart of a method of manufacturing an organic light emitting diode display according to one example embodiment. FIGS. 6A and 6E are cross-sectional views of stages in a method of manufacturing an organic light emitting diode display.

Referring to FIG. 5, a pixel electrode may be formed on a substrate on which thin film transistors are formed (operation S400). Further, referring to FIG. 6A, the pixel electrode 120 is formed on the substrate 110, i.e., a substrate on which thin film transistors are formed, and may be connected to the thin film transistors through a via-hole (not shown).

In detail, the pixel electrode 120 may include a transmission electrode or a reflective electrode based on a display type of the organic light emitting diode display 100. The display type may be a top illumination type or a bottom illumination type.

When the pixel electrode 120 is a transmission electrode, the pixel electrode 120 includes transparent conductive material, e.g., indium tin oxide (ITO), indium zinc oxide (IZO), zinc tin oxide (ZTO), zinc oxide ($ZnO_x$) or tin oxide ($SnO_x$). When the pixel electrode 120 is a reflective electrode, the pixel electrode 120 is formed by forming a reflective layer using at least one of, e.g., silver (Ag), magnesium (Mg), aluminum (Al), platinum (Pt), palladium (Pd), gold (Au), chromium (Cr), tungsten (W), molybdenum (Mo), titanium (Ti) and a combination thereof, and then forming a layer on the reflective layer using, e.g., indium tin oxide (ITO), indium zinc oxide (IZO), zinc oxide ($ZnO_x$) and/or tin oxide ($SnO_x$).

For example, the pixel electrode 120 may be formed by a photolithography process after a sputtering process. In another example, the pixel electrode 120 may be formed by a vacuum deposition process or a sputtering process using a mask.

Next, referring to FIG. 5, the pixel defining layer 130 may be formed to have an opening exposing a predetermined area of the pixel electrode 120 (operation S420). For example, referring to FIG. 6B, after forming a layer with a material for the pixel defining layer 130 on the pixel electrode 120, the opening exposing the predetermined area of the pixel electrode 120 may be formed by patterning, e.g., via an exposure process and a development process. In another example, the pixel defining layer 130 having the opening may be formed by a physical vapor deposition (PVD) or a chemical vapor deposition (CVD) using a mask.

In detail, the pixel defining layer 130 may be formed of an organic material, an inorganic material, or an organic-inorganic material multi-layer. The inorganic material may be, e.g., silicon dioxide ($SiO_2$), silicon nitride ($SiN_x$), and silicon oxynitride (SiON). The organic material may be, e.g., an acryl-based organic compound, polyamide, and polyimide, which are organic insulating materials.

The emission area A, which is the pixel area of the organic light emitting diode display 100, and the non-emission area B which is the non-pixel area of the organic light emitting diode display 100, are defined by the pixel defining layer 130. That is, the pixel electrode 120 exposed by the pixel defining layer 130 is in the emission area A, and part of the pixel electrode 120 and the pixel defining layer 130 is in the non-emission area B.

Next, referring to FIG. 5, the intermediate layer 140 including a light emitting layer may be formed on the pixel electrode 120 which is exposed (operation 440). Further, referring to FIG. 6C, the intermediate layer 140 includes the first common layer 142, the light emitting layer 144, and the second common layer 146 which are sequentially stacked. When power is applied to the pixel electrode 120 and the opposite electrode 140, the light emitting layer 144 emits light.

The first common layer 142 and the second common layer 146 may be formed on the pixel electrode 120 and the pixel defining layer 130 commonly, and the light emitting layer 144 may be formed, e.g., only, on the pixel electrode 120. The first common layer 142 may include a hole injection layer (HIL) and a hole transport layer (HTL) which are sequentially stacked. The second common layer 144 may include an electron transport layer (ETL) and an electron injection layer (EIL) which are sequentially stacked. Besides these layers, other layers may be disposed as necessary. For example, the light emitting layer 144 may be formed of low molecular organic materials, e.g., tris-8-hydroxyquinoline aluminum (Alq3), naphthalene-1-yl-N,N' -diphenyl-benzidine (NPB), and the like. In another example the high molecular organic materials may be used such as polyphenylene vinylene (PPV), polyfluorene, and the like.

Next, referring to FIG. 5, the auxiliary electrode 150 may be formed on the pixel defining layer 130 (operation 460). That is, referring to FIG. 6D, the auxiliary electrode 150 may be formed on the pixel defining layer 130, which is not overlapped with the intermediate layer 140. The auxiliary electrode 150 is disposed in the non-emission area B so that light emission of the pixel is not affected. Further, the auxiliary electrode 150 may be disposed under the opposite electrode 160 and may be electrically connected to the opposite electrode 160. The auxiliary electrode 150, which is formed thicker than the opposite electrode 160, may prevent IR-drop in a large-scaled substrate 110.

The auxiliary electrode 150 may be formed of the same material as the opposite electrode 160, and may have a thickness larger than 1500 Å. The thickness of the auxiliary electrode 150 may be changed considering a scale of the substrate 110, a thickness of the pixel electrode 120, the intermediate layer 140, and the pixel defining layer 130, and the like.

For example, the auxiliary electrode 150 may be formed by a photolithography process after a sputtering process. In another example, the pixel electrode 120 may be formed by a vacuum deposition process or a sputtering process using the mask.

Next, referring to FIG. 5, the opposite electrode 160 may be formed on the intermediate layer 140 and the auxiliary electrode 150, and the power supply electrode may be formed along the side of the substrate 110 (operation 480). That is, referring to FIG. 6E, the thin opposite electrode 160 may be formed to prevent a dark spot defect, e.g., caused by a potential short circuit between the pixel electrode and the opposite electrode. That is, when the opposite electrode 160 is formed on the intermediate layer 140 with a thin thickness according to example embodiments, the material of the opposite electrode 160 may not flow into the pixel electrode 120. For example, the opposite electrode 160 may be formed with a thickness of about 300 Å to about 1500 Å, but a thickness of the opposite electrode 160 may be changed in accordance with a scale of the substrate 110, a thickness of the pixel electrode 120, intermediate layer 140, and the pixel defining layer 130.

The opposite electrode 160 may include a transmission electrode or a reflective electrode. When the opposite electrode 160 is a transmission electrode, the material of the opposite electrode 160 may be one of lithium (Li), calcium (Ca), lithium fluoride/calcium (LiF/Ca), lithium fluoride/aluminum (LiF/Al), aluminum (Al), magnesium (Mg), argentums (Ag), chrome (Cr), tungsten (W), molybdenum (Mo), titanium (Ti), and a combination thereof.

The power supply electrode 170 and the opposite electrode 160 may be formed at the same time. The power supply electrode 170 and the opposite electrode 160 may include the same material. The power supply electrode 170 and the opposite electrode 160 may be formed to have different thicknesses.

The thick power supply electrode 170 may be formed to compensate for the IR-drop caused by the thin opposite electrode 160. The thickness of the power supply electrode 170 may be determined by the height of the opposite electrode 160, i.e., the thickness of the power supply electrode 170 may equal a thickness sum of the pixel defining layer 130, the auxiliary electrode 150, and the opposite electrode 160.

The materials and methods for the described processes are illustrative examples. Thus, other materials and methods for the processes may be used.

By way of summary and review, by forming a thin opposite electrode, a defect rate may be decreased and the yield may be increased because a short circuit between a pixel electrode and the thin opposite electrode of an organic light emitting display device may be prevented even if impurities remain on the substrate. That is, an organic light emitting display device according to example embodiments includes a thin opposite electrode and a thick auxiliary electrode, so material of the thin opposite electrode above the intermediate layer 140 does not leak through the intermediate layer 140. As such, even if impurities remain on the substrate, e.g., in the intermediate layer 140, a short circuit between the opposite electrode and the pixel electrode may be prevented or substantially minimized. Further, the IR-drop caused by the thin opposite electrode may be compensated by the auxiliary electrode and the power supply electrode. Accordingly, since a short circuit between the opposite electrode and the pixel electrode may be prevented, the dark spot defect caused by the impurities may be prevented as well. Further, example embodiments provide a method of manufacturing an organic light emitting display device capable of decreasing the dark spot defect caused by the impurities.

In contrast, during manufacturing of a conventional organic light emitting display device, a cleaning process is performed to remove particles in order to improve image display quality. However, after the cleaning process, some particles may remain, e.g., move to a substrate, and function as impurities. When impurities remain on the substrate on which thin transistors are formed, a cathode and an anode of the light emitting element may be electrically disconnected in a stacked structure of cathode/organic layers/anode. As such, dark spots may be generated by the electrical disconnection, thereby forming defect of a pixel.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the embodiments. Accordingly, all such modifications are intended to be included within the scope of the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting diode display, comprising:
   a substrate including a thin film transistor;
   a plurality of pixels on a pixel area of the substrate;
   a plurality of auxiliary electrodes between the pixels;
   an opposite electrode on the pixels and on the auxiliary electrodes, the opposite electrode being electrically connected to the auxiliary electrodes, and including a same material as the auxiliary electrodes; and
   a power supply electrode on the substrate, the power supply electrode being in a periphery of the pixel area and being configured to supply power to the pixels,
   wherein the auxiliary electrodes are under the opposite electrode, the auxiliary electrodes being thicker than the opposite electrode.

2. The organic light emitting diode display as claimed in claim 1, wherein the auxiliary electrodes are between the pixels in a longitudinal direction of the substrate.

3. The organic light emitting diode display as claimed in claim 1, wherein the auxiliary electrodes are between the pixels in a horizontal direction of the substrate.

4. The organic light emitting diode display as claimed in claim 1, wherein the auxiliary electrodes are between the pixels in a longitudinal direction and a horizontal direction of the substrate.

5. The organic light emitting diode display as claimed in claim 1, wherein the auxiliary electrodes are straight lines.

6. The organic light emitting diode display as claimed in claim 1, wherein the auxiliary electrodes are dotted lines.

7. The organic light emitting diode display as claimed in claim 1, wherein only the opposite electrode among the opposite electrode and the auxiliary electrodes overlaps the pixels.

8. The organic light emitting diode display as claimed in claim 1, wherein an upper surface of power supply electrode is level with an upper surface of the opposite electrode.

9. The organic light emitting diode display as claimed in claim 1, wherein the power supply electrode is disposed on two opposite sides of the substrate along edges of the substrate in a row direction.

10. The organic light emitting diode display as claimed in claim 1, wherein the power supply electrode is on a single side of the substrate along an edge of the substrate in a row direction.

11. The organic light emitting diode display as claimed in claim 1, wherein the auxiliary electrodes and the opposite electrode consist essentially of the same material.

12. The organic light emitting diode display as claimed in claim 1, wherein the opposite electrode directly contacts and overlaps an entire upper surface of the auxiliary electrodes.

13. The organic light emitting diode display as claimed in claim 12, wherein a lowermost surface of the opposite electrode is level with a lowermost surface of the auxiliary electrodes.

14. The organic light emitting diode display as claimed in claim 1, further comprising:
- a pixel electrode on the pixel area of the substrate and electrically connected to the thin film transistor; and
- a pixel defining layer covering edges of the pixel electrode and having an opening exposing a portion of an upper surface of the pixel electrode, the auxiliary electrodes being on an upper surface of the pixel defining layer.

15. A method of manufacturing an organic light emitting display device, the method comprising:
- forming a thin film transistor on a substrate, the substrate including a plurality of pixels on a pixel area;
- forming a pixel electrode on the pixel area of the substrate, the pixel electrode being electrically connected to the thin film transistor;
- forming a pixel defining layer having an opening exposing the pixel electrode on the substrate;
- forming an intermediate layer including a light emitting layer on the pixel electrode exposed through the opening of the pixel defining layer;
- forming a plurality of auxiliary electrodes on the pixel defining layer, the auxiliary electrodes being between the plurality of pixels;
- forming an opposite electrode on the intermediate layer and on the auxiliary electrodes, the opposite electrode being electrically connected to the auxiliary electrodes and being formed of a same material as the auxiliary electrodes; and
- forming a power supply electrode on the substrate, the power supply electrode being in a periphery of the pixel area and being configured to supply power to the pixels,
- wherein the auxiliary electrodes are under the opposite electrode, the auxiliary electrodes being thicker than the opposite electrode.

16. The method as claimed in claim 15, wherein the intermediate layer includes a first common layer, the light emitting layer, and a second common layer.

17. The method as claimed in claim 16, wherein the first common layer and the second common layer overlap the pixel defining layer and the pixel electrode, the light emitting layer being formed on the pixel electrode.

18. The method as claimed in claim 16, wherein the first common layer includes a hole injection layer and a hole transport layer which are sequentially stacked.

19. The method as claimed in claim 16, wherein the second common layer includes an electron transport layer and an electron injection layer which are sequentially stacked.

20. The method as claimed in claim 15, wherein an upper surface of power supply electrode is level with an upper surface of the opposite electrode.

* * * * *